(12) United States Patent
Senda et al.

(10) Patent No.: US 9,209,355 B2
(45) Date of Patent: Dec. 8, 2015

(54) LIGHT-EMITTING DEVICE

(71) Applicants: Naoyuki Senda, Atsugi (JP); Yoshitaka Dozen, Atsugi (JP); Kohei Yokoyama, Fujisawa (JP); Manabu Niboshi, Osaka (JP); Yuto Tsukamoto, Osaka (JP); Satoshi Inoue, Osaka (JP); Shinichi Kawato, Osaka (JP); Katsuhiro Kikuchi, Osaka (JP)

(72) Inventors: Naoyuki Senda, Atsugi (JP); Yoshitaka Dozen, Atsugi (JP); Kohei Yokoyama, Fujisawa (JP); Manabu Niboshi, Osaka (JP); Yuto Tsukamoto, Osaka (JP); Satoshi Inoue, Osaka (JP); Shinichi Kawato, Osaka (JP); Katsuhiro Kikuchi, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/192,062

(22) Filed: Feb. 27, 2014

(65) Prior Publication Data
US 2014/0252383 A1  Sep. 11, 2014

(30) Foreign Application Priority Data

Mar. 8, 2013  (JP) .................................. 2013-046907

(51) Int. Cl.
*H01L 33/08*  (2010.01)
*H01L 33/58*  (2010.01)
*H01L 51/50*  (2006.01)
(Continued)

(52) U.S. Cl.
CPC ............ *H01L 33/08* (2013.01); *H01L 27/3246* (2013.01); *H01L 33/58* (2013.01); *H01L 51/5044* (2013.01)

(58) Field of Classification Search
USPC .................................. 257/79, 98, 99, E33.062
See application file for complete search history.

(56) References Cited

U.S. PATENT DOCUMENTS 5,119,156 A   6/1992  Kawahara et al.
6,373,453 B1  4/2002  Yudasaka
(Continued)

FOREIGN PATENT DOCUMENTS

JP    11-339958 A   12/1999
JP    2001-148291   5/2001
(Continued)

OTHER PUBLICATIONS

Berman-Mendoza et al. "UV detectors: Silicon-rich silicon oxide films boost UV sensitivity," Sep. 1, 2005, LaserFocusWorld.com, vol. 41, issue 9.*

*Primary Examiner* — Kimberly Rizkallah
*Assistant Examiner* — Bo Bin Jang
(74) *Attorney, Agent, or Firm* — Eric J. Robinson; Robinson Intellectual Property Law Office, P.C.

(57) ABSTRACT

Occurrence of a crosstalk phenomenon in a light-emitting device is inhibited. The light-emitting device includes an insulating layer; a first lower electrode over the insulating layer; a second lower electrode over the insulating layer; a structure over the insulating layer and between the first lower electrode and the second lower electrode; a first partition wall between the first lower electrode and the structure, over the insulating layer; a second partition wall between the second lower electrode and the structure, over the insulating layer; a first light-emitting unit over the first lower electrode, the first partition wall, the structure, the second partition wall, and the second lower electrode; an intermediate layer over the first light-emitting unit; a second light-emitting unit over the intermediate layer; and an upper electrode over the second light-emitting unit.

23 Claims, 9 Drawing Sheets

(51) Int. Cl.
*H01L 27/32* (2006.01)
*H01L 33/36* (2010.01)

(56) References Cited

U.S. PATENT DOCUMENTS

| | | | |
|---|---|---|---|
| 6,392,722 B1 | 5/2002 | Sekime et al. |
| 6,420,834 B2 | 7/2002 | Yamazaki et al. |
| 6,469,439 B2 | 10/2002 | Himeshima et al. |
| 6,555,968 B2 | 4/2003 | Yamazaki et al. |
| 6,559,594 B2 | 5/2003 | Fukunaga et al. |
| 6,597,121 B2 | 7/2003 | Imura |
| 6,614,174 B1 | 9/2003 | Urabe et al. |
| 6,618,029 B1 | 9/2003 | Ozawa |
| 6,720,198 B2 | 4/2004 | Yamagata et al. |
| 6,750,618 B2 | 6/2004 | Yamazaki et al. |
| 6,768,257 B1 | 7/2004 | Yamada et al. |
| 6,798,132 B2 | 9/2004 | Satake |
| 6,815,723 B2 | 11/2004 | Yamazaki et al. |
| 6,828,726 B2 | 12/2004 | Sakurai et al. |
| 6,969,291 B2 | 11/2005 | Urabe et al. |
| 6,991,506 B2 | 1/2006 | Yamada et al. |
| 6,992,439 B2 | 1/2006 | Yamazaki et al. |
| 7,015,503 B2 | 3/2006 | Seki et al. |
| 7,057,209 B2 | 6/2006 | Yamazaki et al. |
| 7,098,602 B2 | 8/2006 | Yamazaki et al. |
| 7,173,281 B2 | 2/2007 | Hirakata et al. |
| 7,214,959 B2 | 5/2007 | Seki et al. |
| 7,221,338 B2 | 5/2007 | Yamazaki et al. |
| 7,265,391 B2 | 9/2007 | Yamazaki et al. |
| 7,273,801 B2 | 9/2007 | Seki et al. |
| 7,384,860 B2 | 6/2008 | Nakamura et al. |
| 7,399,991 B2 | 7/2008 | Seo et al. |
| 7,402,948 B2 | 7/2008 | Yamazaki et al. |
| 7,420,210 B2 | 9/2008 | Yamazaki et al. |
| 7,423,293 B2 | 9/2008 | Yamagata et al. |
| 7,442,955 B2 | 10/2008 | Seki et al. |
| 7,585,761 B2 | 9/2009 | Yamazaki et al. |
| 7,623,098 B2 | 11/2009 | Yamazaki et al. |
| 7,623,099 B2 | 11/2009 | Yamazaki et al. |
| 7,623,100 B2 | 11/2009 | Yamazaki et al. |
| 7,662,011 B2 | 2/2010 | Yamazaki et al. |
| 7,683,535 B2 | 3/2010 | Fukunaga et al. |
| 7,692,186 B2 | 4/2010 | Yamazaki et al. |
| 7,697,106 B2 | 4/2010 | Sawasaki et al. |
| 7,719,014 B2 | 5/2010 | Yamazaki et al. |
| 7,745,993 B2 | 6/2010 | Fukunaga et al. |
| 7,753,751 B2 | 7/2010 | Yamazaki |
| 7,792,489 B2 | 9/2010 | Hirakata et al. |
| 7,902,746 B2 | 3/2011 | Park |
| 7,932,518 B2 | 4/2011 | Seki et al. |
| 7,977,876 B2 | 7/2011 | Yamazaki et al. |
| 7,982,206 B2 | 7/2011 | Yamazaki et al. |
| 7,990,348 B2 | 8/2011 | Yamazaki et al. |
| 8,026,531 B2 | 9/2011 | Seo et al. |
| 8,089,066 B2 | 1/2012 | Yamazaki et al. |
| 8,119,468 B2 | 2/2012 | Miyairi et al. |
| 8,138,032 B2 | 3/2012 | Miyairi et al. |
| 8,194,008 B2 | 6/2012 | Yamazaki et al. |
| 8,237,355 B2 | 8/2012 | Yamazaki |
| 8,432,097 B2 | 4/2013 | Hirakata et al. |
| 8,441,185 B2 | 5/2013 | Kuwabara et al. |
| 2001/0004469 A1 | 6/2001 | Himeshima et al. |
| 2002/0047514 A1 | 4/2002 | Sakurai et al. |
| 2002/0093286 A1 | 7/2002 | Ohshita et al. |
| 2003/0146439 A1 | 8/2003 | Yamazaki et al. |
| 2003/0189400 A1 | 10/2003 | Nishio et al. |
| 2004/0061118 A1 | 4/2004 | Yamazaki et al. |
| 2006/0081844 A1 | 4/2006 | Hirosue et al. |
| 2007/0015430 A1 | 1/2007 | Nishio et al. |
| 2007/0045621 A1 | 3/2007 | Suzuki et al. |
| 2007/0194321 A1 | 8/2007 | Yamazaki et al. |
| 2009/0009069 A1 | 1/2009 | Takata |
| 2009/0020751 A1 | 1/2009 | Seki et al. |
| 2009/0290273 A1* | 11/2009 | Shih et al. ......... 361/56 |
| 2010/0171138 A1 | 7/2010 | Yamazaki et al. |
| 2011/0266548 A1 | 11/2011 | Yamazaki et al. |
| 2011/0273080 A1 | 11/2011 | Kimura et al. |
| 2012/0007110 A1 | 1/2012 | Seo et al. |
| 2012/0217516 A1 | 8/2012 | Hatano et al. |
| 2012/0273804 A1* | 11/2012 | Hatano ............ 257/79 |
| 2012/0305922 A1 | 12/2012 | Yamazaki |
| 2012/0326201 A1 | 12/2012 | Ohnuma et al. |
| 2013/0001620 A1* | 1/2013 | Sugisawa et al. ....... 257/98 |
| 2014/0103368 A1 | 4/2014 | Hatano et al. |
| 2014/0103385 A1 | 4/2014 | Hatano et al. |
| 2014/0175469 A1 | 6/2014 | Dozen et al. |
| 2014/0183501 A1* | 7/2014 | Kim et al. ............ 257/40 |

FOREIGN PATENT DOCUMENTS

| | | |
|---|---|---|
| JP | 2001-195008 | 7/2001 |
| JP | 2002-324673 A | 11/2002 |
| JP | 2003-059671 A | 2/2003 |
| JP | 2003-123969 A | 4/2003 |
| JP | 2003-243171 A | 8/2003 |
| JP | 2003-257650 | 9/2003 |
| JP | 2005-235491 A | 9/2005 |
| JP | 2006-302870 | 11/2006 |
| JP | 2007-141821 A | 6/2007 |
| JP | 2008-234885 | 10/2008 |
| JP | 2010-027591 | 2/2010 |

* cited by examiner

FIG. 7A
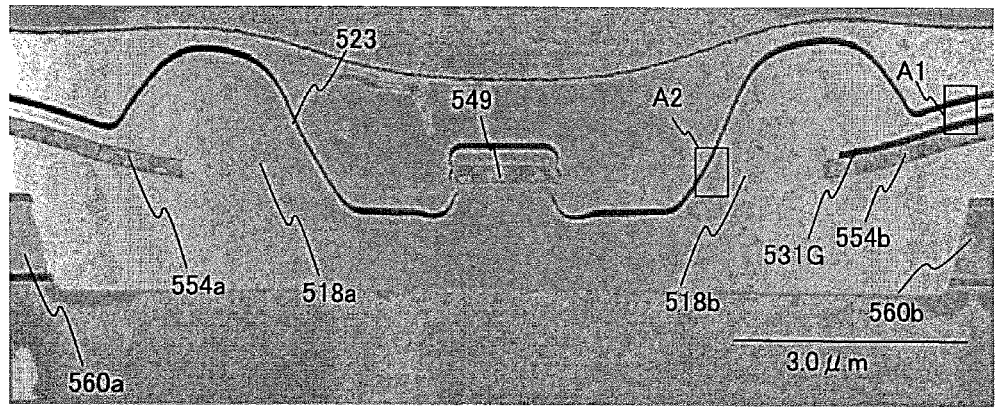
FIG. 7B    FIG. 7C
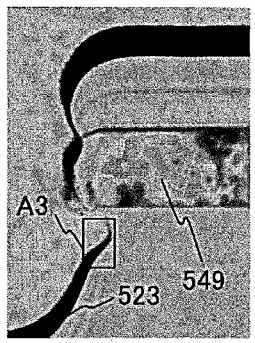 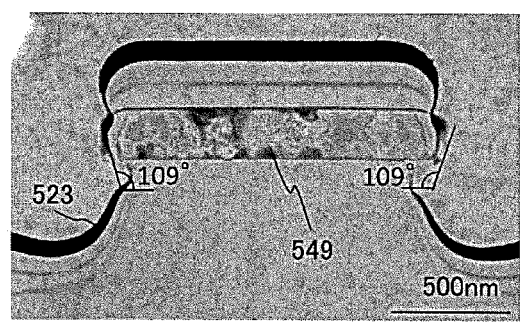
FIG. 7D
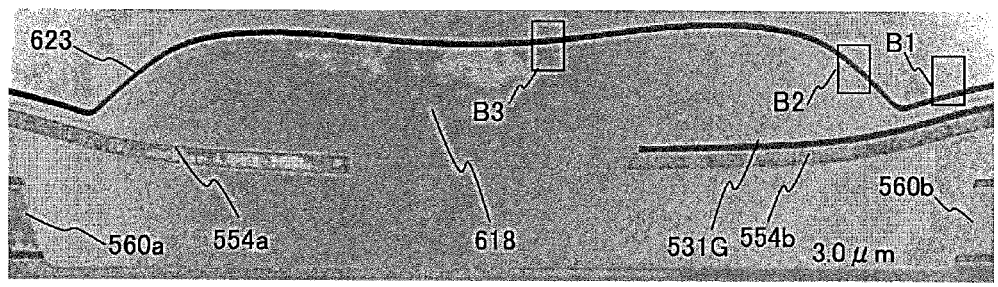

LIGHT-EMITTING DEVICE

BACKGROUND OF THE INVENTION

1. Field of the Invention

The present invention relates to a light-emitting device that has a light-emitting element.

2. Description of the Related Art

Commercialization of organic EL displays is accelerating. Displays are increasingly required to provide high luminance for outdoor use. It is known that the luminance of organic EL elements increases in proportion to electric current and light emission at high luminance can be achieved.

However, a large current flow accelerates deterioration of organic EL elements. Thus, if high luminance can be achieved with a small amount of current, light-emitting elements can have longer lifetime. In this regard, a tandem element in which a plurality of light-emitting units is stacked has been proposed as a light-emitting element capable of providing high luminance with a small amount of current (see Patent Document 1, for example).

Note that in this specification, a light-emitting unit refers to a layer or a stacked body which includes one region where electrons and holes injected from both ends are recombined.

A tandem element including two light-emitting units, for example, can emit light equivalent to that of a light-emitting element including one light-emitting unit by current with half the density of the light-emitting element including one light-emitting unit. In addition, a structure in which n light-emitting units are stacked between electrodes, for example, can provide n times the luminance of one light-emitting unit without increasing current density.

One problem of a light-emitting panel in which tandem elements are provided adjacently is occurrence of a crosstalk phenomenon. The crosstalk phenomenon refers to a phenomenon in which, when a light-emitting layer and a layer having higher conductivity than that of the light-emitting layer are provided in a plurality of sub-pixels as common layers, current leaks to an adjacent sub-pixel through the layer with higher conductivity. For example, when a tandem element has a structure in which a first light-emitting unit including a first light-emitting layer and a second light-emitting unit including a second light-emitting layer are stacked and an intermediate layer having higher conductivity than the conductivity of the first light-emitting layer and that of the second light-emitting layer is provided between the first and second light-emitting units, current leaks to an adjacent tandem element through the intermediate layer. Note that a problem of the crosstalk phenomenon similarly occurs in a single element in which a carrier-injection layer (a hole-injection layer or an electron-injection layer) is used as a common layer.

A tandem element includes a stack of a plurality of layers with a highly conductive intermediate layer therebetween, and includes a layer with high conductivity and a layer with low conductivity because of its structure. In addition, in the tandem element, a mixed layer of an organic compound and a metal oxide or a highly conductive carrier-injection layer of a conductive high molecular compound is often used in order to suppress an increase of driving voltage. Furthermore, electrical resistance between an anode and a cathode is higher in the tandem element than in a single element; thus, current is easily transmitted to an adjacent pixel through the highly conductive layer.

FIG. 9A is a schematic diagram for describing the crosstalk phenomenon caused by an intermediate layer 86 with high conductivity. FIG. 9A is a cross-sectional view in which three stripes of tandem elements that emit white light are arranged in a light-emitting panel (white-light-emitting panel) and only a second tandem element is driven.

The light-emitting panel includes first to third tandem elements which are adjacent to one another. The first tandem element is provided between an upper electrode 81 and a first lower electrode 82. The second tandem element is provided between the upper electrode 81 and a second lower electrode 83. The third tandem element is provided between the upper electrode 81 and a third lower electrode 84.

In each of the first to third tandem elements, a first light-emitting unit 85, the intermediate layer 86, and a second light-emitting unit 87 are sequentially stacked. For example, when the first light-emitting unit 85 includes a light-emitting layer that emits blue light and the second light-emitting unit 87 includes a light-emitting layer that emits green light and a light-emitting layer that emits red light, each tandem element can provide white light emission.

In the case of using a light-transmitting upper electrode, a counter glass substrate 88 can be arranged over the upper electrode and reflective electrodes can be used as the lower electrodes. The counter glass substrate 88 is provided with a blue color filter, a red color filter, and a green color filter which are not illustrated. The red color filter, the blue color filter, and the green color filter overlap with the first lower electrode 82, the second lower electrode 83, and the third lower electrode 84, respectively.

When only the blue line (the second tandem element) is driven in the above-described light-emitting panel by application of a voltage between the second lower electrode 83 and the upper electrode 81, current might leak to the adjacent first or third tandem element through the highly conductive intermediate layer 86, causing the red line (the first tandem element) or the green line (the third tandem element) to emit light and the crosstalk phenomenon to occur.

FIG. 9B is a schematic view for describing the crosstalk phenomenon caused by a highly conductive carrier-injection layer (hole-injection or electron-injection layer) 89. In FIG. 9B, only a blue line (a second tandem element) is driven in a light-emitting panel (white-light-emitting panel).

In each of first to third tandem elements, a first light-emitting unit 85 including the highly conductive carrier-injection layer 89, an intermediate layer 86, and a second light-emitting unit 87 are sequentially stacked. As an example of the carrier-injection layer 89, a highly conductive layer containing a mixed material of an organic compound and a metal oxide, a conductive high molecular compound, or the like can be given.

REFERENCE

Patent Document

[Patent Document 1] Japanese Published Patent Application No. 2008-234885

SUMMARY OF THE INVENTION

An object of one embodiment of the present invention is to prevent occurrence of a crosstalk phenomenon in a light-emitting device.

One embodiment of the present invention is a light-emitting device including an insulating layer; a first lower electrode over the insulating layer; a second lower electrode over the insulating layer; a structure over the insulating layer and between the first lower electrode and the second lower electrode; a first partition wall between the first lower electrode and the structure, the first partition wall covering an end portion of the first lower electrode; a second partition wall between the second lower electrode and the structure, the second partition wall covering an end portion of the second lower electrode; a first light-emitting unit over the first lower electrode, the first partition wall, the structure, the second partition wall, and the second lower electrode; an intermediate layer over the first light-emitting unit; a second light-emitting unit over the intermediate layer; and an upper electrode over the second light-emitting unit.

One embodiment of the present invention is a light-emitting device including an insulating layer; a first lower electrode over the insulating layer; a second lower electrode over the insulating layer; a structure over the insulating layer and between the first lower electrode and the second lower electrode; a groove portion in the insulating layer and between the first lower electrode and the structure and between the second lower electrode and the structure; a first partition wall between the first lower electrode and the structure, the first partition wall covering the end portion of the first lower electrode; a second partition wall between the second lower electrode and the structure, the second partition wall covering the end portion of the second lower electrode; a first light-emitting unit over the first lower electrode, the first partition wall, the structure, the second partition wall, and the second lower electrode; an intermediate layer over the first light-emitting unit; a second light-emitting unit over the intermediate layer; and an upper electrode over the second light-emitting unit.

One embodiment of the present invention is a light-emitting device including an insulating layer; a first lower electrode over the insulating layer; a second lower electrode over the insulating layer; a groove portion in the insulating layer and between the first lower electrode and the second lower electrode; a structure over the insulating layer and in the groove portion; a first partition wall in the groove portion and over the insulating layer, the first partition wall covering an end portion of the first lower electrode; a second partition wall in the groove portion and over the insulating layer, the second partition wall covering an end portion of the second lower electrode; a first light-emitting unit over the first lower electrode, the first partition wall, the structure, the second partition wall, and the second lower electrode; an intermediate layer over the first light-emitting unit; a second light-emitting unit over the intermediate layer; and an upper electrode over the second light-emitting unit.

It is preferable that the above embodiment of the present invention further include at least one of an optical adjustment layer formed between the first lower electrode and the first light-emitting unit and an optical adjustment layer formed between the second lower electrode and the first light-emitting unit, and that the structure be a stacked structure which includes a layer formed using the same layer as the first lower electrode and a layer formed using the same layer as the optical adjustment layer.

In the above embodiment of the present invention, a thickness of the intermediate layer over a side surface of the structure in a direction perpendicular to the side surface of the structure may be smaller than a thickness of the intermediate layer over the first lower electrode in a direction perpendicular to the first lower electrode.

In the above embodiment of the present invention, the first light-emitting unit may include a carrier-injection layer. In addition, a thickness of the carrier-injection layer over the side surface of the structure in the direction perpendicular to the side surface of the structure may be smaller than a thickness of the carrier-injection layer over the first lower electrode in the direction perpendicular to the first lower electrode.

In the above embodiment of the present invention, an EL layer may include the first light-emitting unit, the intermediate layer, and the second light-emitting unit. In addition, a thickness of the EL layer over the side surface of the structure in the direction perpendicular to the side surface of the structure may be smaller than a thickness of the EL layer over the first lower electrode in the direction perpendicular to the first lower electrode.

In the above embodiment of the present invention, an angle formed by a bottom surface and a side surface of the structure is preferably greater than or equal to 60° and less than or equal to 110°.

In the above embodiment of the present invention, the structure preferably separates the first lower electrode and the second lower electrode.

In the above embodiment of the present invention, the structure is preferably formed using the same layer as the first lower electrode.

It is preferable that the above embodiment of the present invention further include a color filter near or in contact with the upper electrode which is over the first partition wall and the second partition wall, and the color filter include a color filter with a first color overlapping with the first lower electrode and a color filter with a second color overlapping with the second lower electrode.

In the above embodiment of the present invention, the first partition wall and the second partition wall may be colored.

One embodiment of the present invention is a light-emitting device including an insulating layer; a plurality of lower electrodes over the insulating layer; a structure over the insulating layer and between the plurality of lower electrodes, the structure surrounding each of the plurality of lower electrodes; a partition wall over the insulating layer and between the structure and the plurality of lower electrodes, the partition wall surrounding each of the plurality of lower electrodes; a first light-emitting unit over the plurality of lower electrodes, the partition wall, and the structure; an intermediate layer over the first light-emitting unit; a second light-emitting unit over the intermediate layer; and an upper electrode over the second light-emitting unit.

Note that a light-emitting device in this specification includes a display device having a light-emitting element in a pixel (or a sub-pixel). A light-emitting panel includes a display panel in which pixels each having a light-emitting element are provided adjacently. Note that a light-emitting module includes a light-emitting element, and the light-emitting element has a light-emitting unit including a light-emitting layer.

The application of one embodiment of the present invention can suppress occurrence of a crosstalk phenomenon.

BRIEF DESCRIPTION OF THE DRAWINGS

FIG. 7A is a cross-sectional image of the light-emitting panel of Example between sub-pixels 562B and 562G, FIGS. 7B and 7C are enlarged cross-sectional images of a region around the side surfaces of a structure 549, and FIG. 7D is a cross-sectional image of the light-emitting panel of a comparative example between sub-pixels 662B and 662G.

DETAILED DESCRIPTION OF THE INVENTION

Embodiments of the present invention will be described below in detail with reference to the drawings. Note that the present invention is not limited to the following description, and it is easily understood by those skilled in the art that the mode and details can be variously changed without departing from the spirit and scope of the present invention. Accordingly, the present invention should not be interpreted as being limited to the content of the embodiments below.

Embodiment 1

Structure of Display Panel

Figure 1A:
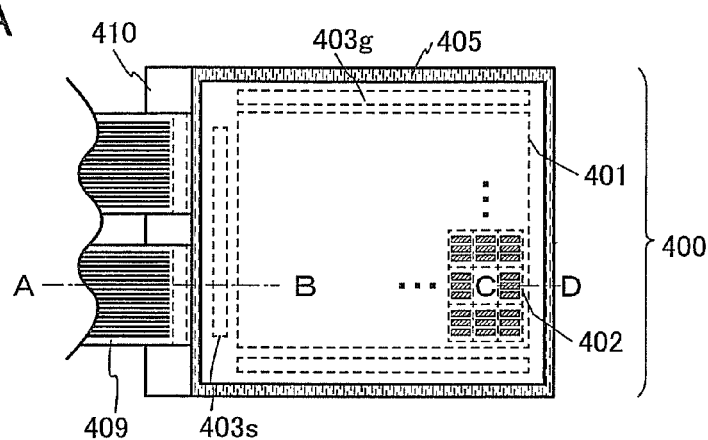
FIG. 1A is a top view of a structure of a display panel which can be used for a display device in one embodiment of the present invention.
Figure 1B:
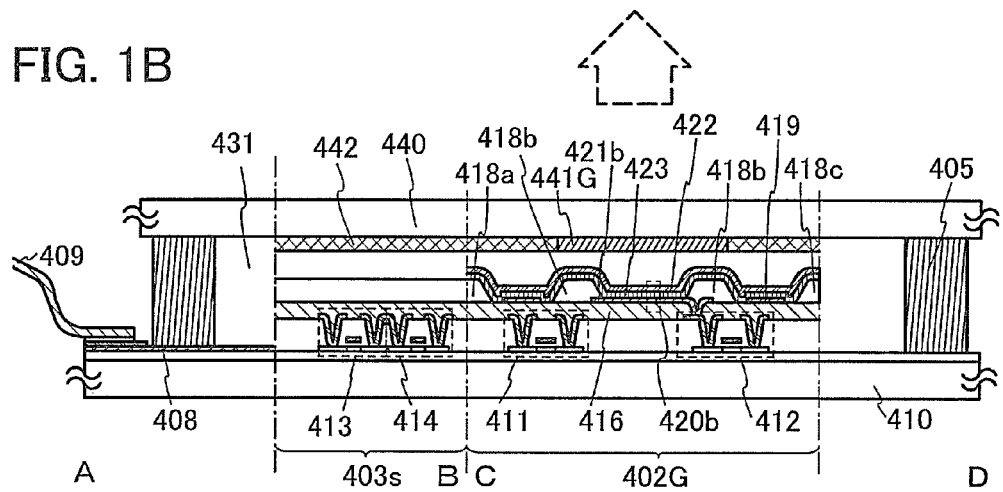
FIG. 1B is a side view of the structure including cross sections along section lines A-B and C-D in FIG. 1A.

FIGS. 1A and 1B illustrate a structure of a display panel which can be used for a display device in one embodiment of the present invention. FIG. 1A is a top view of the structure of the display panel which can be used for a display device in one embodiment of the present invention. FIG. 1B is a side view of the structure including cross sections along section lines A-B and C-D in FIG. 1A.

A display panel 400 shown as an example in this embodiment includes a display portion 401 over a first substrate 410. The display portion 401 includes a plurality of pixels 402. The pixel 402 includes a plurality of sub-pixels (e.g., three sub-pixels) (see FIG. 1A). Over the first substrate 410, in addition to the display portion 401, a source side driver circuit portion 403s and a gate side driver circuit portion 403g which drive the display portion 401 are provided. Note that the driver circuit portions can be provided not over the first substrate 410 but externally.

The display panel 400 includes an external input terminal and receives a video signal, a clock signal, a start signal, a reset signal, and the like from a flexible printed circuit (FPC) 409.

A sealant 405 bonds the first substrate 410 and a second substrate 440. The display portion 401 is provided in a space 431 formed between the substrates (see FIGS. 1A and 1B).

The structure including the cross sections of the display panel 400 is described with reference to FIG. 1B. The display panel 400 includes the source side driver circuit portion 403s, a sub-pixel 402G included in the pixel 402, and a lead wiring 408. Note that the display portion 401 of the display panel 400 shown as an example in this embodiment emits light in the direction denoted by the arrow in the drawing, thereby displaying images.

The source side driver circuit portion 403s includes a CMOS circuit which is a combination of an n-channel transistor 413 and a p-channel transistor 414. Note that the driver circuit is not limited to this structure and may be various circuits, such as a CMOS circuit, a PMOS circuit, or an NMOS circuit.

The lead wiring 408 transmits a signal inputted from the external input terminal to the source side driver circuit portion 403s and the gate side driver circuit portion 403g.

The sub-pixel 402G includes a switching transistor 411, a current control transistor 412, a second light-emitting element 420b, and a color filter 441G. The structure 419 is provided between the sub-pixel 402G and an adjacent sub-pixel. An insulating layer 416 is formed over the transistor 411 and the like.

The second light-emitting element 420b includes a second lower electrode 421b, an upper electrode 422, and a layer 423 containing a light-emitting organic compound (hereinafter also referred to as an EL layer) which is provided between the second lower electrode 421b and the upper electrode 422. The end portions of the second lower electrode 421b are covered with a second partition wall 418b. In the second light-emitting element 420b, an electrode which transmits light from the EL layer 423 is used as the electrode on the light emission side, and a material which reflects the light is used for the electrode on a side opposite to the light emission side. In addition, the color filter 441G is provided on the light emission side. In the second light-emitting element 420b shown as an example in this embodiment, the second lower electrode 421b has a light-reflecting property and the upper electrode 422 has a light-transmitting property. Note that the image display direction of the display portion 401 is determined in accordance with the direction in which light emitted from the second light-emitting element 420b is extracted.

In addition, a light-blocking film 442 is formed so as to surround the color filter 441G. The light-blocking film 442 prevents reflection of light from outside by the display panel 400 and has an effect of increasing the contrast of images displayed on the display portion 401. Note that the color filter 441G and the light-blocking film 442 are formed on the second substrate 440.

The insulating layer 416 is an insulating layer for planarizing a step caused by the structure of the transistor 411 and the like or for suppressing impurity diffusion into the transistor 411 and the like. The insulating layer 416 can be a single layer or a stacked layer. A first partition wall 418a, the second partition wall 418b, and a third partition wall 418c are insulating layers which cover the end portions of the lower electrodes of the light-emitting elements and have openings. The first to third partition walls 418a to 418c are formed by patterning between the lower electrodes and formed along the edges of the lower electrodes. The second partition wall 418b covers the end portions of the second lower electrode 421b. The first partition wall 418a and the third partition wall 418c cover the end portions of the lower electrodes of the light-emitting elements included in the sub-pixels adjacent to the sub-pixel 420G. The second light-emitting element 420b is formed in the opening of the second partition wall 418b.

The structure 419 is provided each between the second partition wall 418b and the first partition wall 418a and between the second partition wall 418b and the third partition wall 418c. The light-blocking film 442 overlaps the structure 419. Each side surface and the upper surface of the structure 419 are in contact with the EL layer 423. Details of the structure 419 will be described later.

Structure of Transistor

Top-gate transistors are used in the display panel 400 shown in FIG. 1A. However, the present invention is not limited to this example, and bottom-gate transistors may be used. Various types of transistors can be used for the source side driver circuit portion 403s, the gate side driver circuit portion 403g, and the sup-pixels. Note that various semiconductors can be used for regions where channels of these transistors are formed. Specifically, as well as amorphous silicon, polysilicon, or single crystal silicon, an oxide semiconductor or the like can be used. As an example of an oxide semiconductor, an oxide semiconductor containing at least indium (In) or zinc (Zn) can be given, and an oxide semiconductor containing In and Zn is preferable. Further, these oxide semiconductors containing gallium (Ga) or tin (Sn) or both of them are particularly preferable.

When a single crystal semiconductor is used for a region where a channel of a transistor is formed, the size of the transistor can be reduced, which results in even higher resolution pixels in a display portion.

As a single crystal semiconductor used for forming a semiconductor layer, a semiconductor substrate, such as a single crystal silicon substrate, or a silicon on insulator (SOI) substrate in which a single crystal semiconductor layer is provided on an insulating surface can be used.

Sealing Structure

The display panel 400 of this embodiment has a structure in which the light-emitting element is sealed in the space 431 enclosed by the first substrate 410, the second substrate 440, and the sealant 405 (see FIGS. 1A and 1B).

The space 431 can be filled with an inert gas (e.g., nitrogen or argon) or resin. An absorbent for impurities (typically, water and/or oxygen) such as a dry agent may be provided in the space 431.

The sealant 405 and the second substrate 440 are desirably formed using a material which transmits impurities in the air (such as water and/or oxygen) as little as possible. An epoxy-based resin, glass frit, or the like can be used for the sealant 405.

Examples of the second substrate 440 include a glass substrate; a quartz substrate; a plastic substrate formed of polyvinyl fluoride (PVF), polyester, an acrylic resin, or the like; a substrate of fiberglass-reinforced plastics (FRP); and the like.

Next, specific pixel configurations 1 to 5 will be described.

Pixel Configuration 1

Figure 2A:
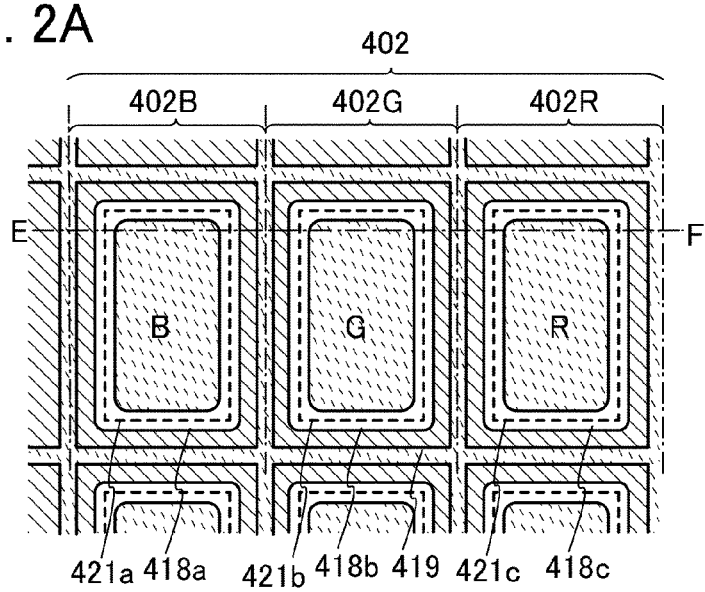
FIG. 2A is a plan view of a pixel 402.
Figure 2B:
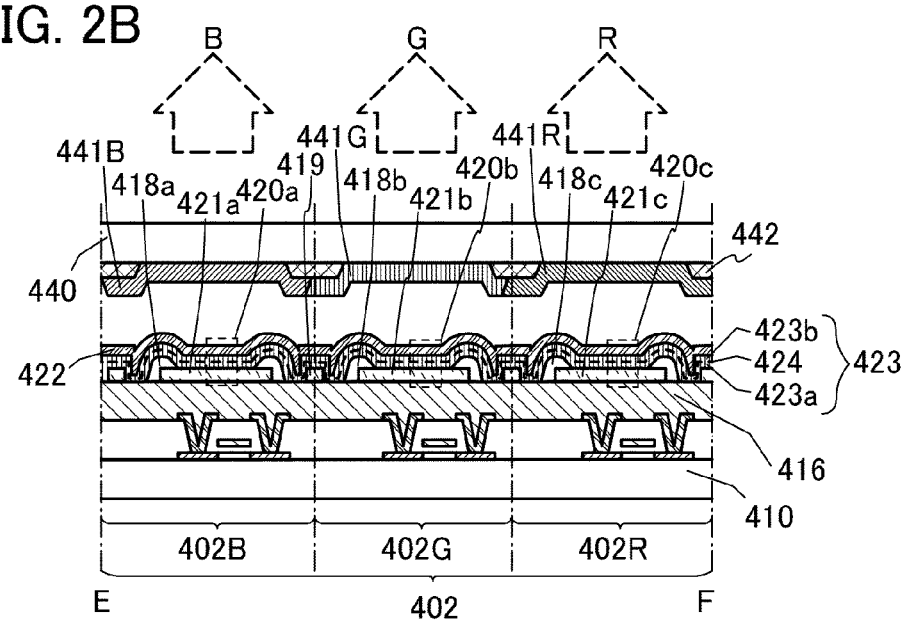
FIG. 2B is a cross-sectional view along a section line E-F in FIG. 2A.
Figure 2C:
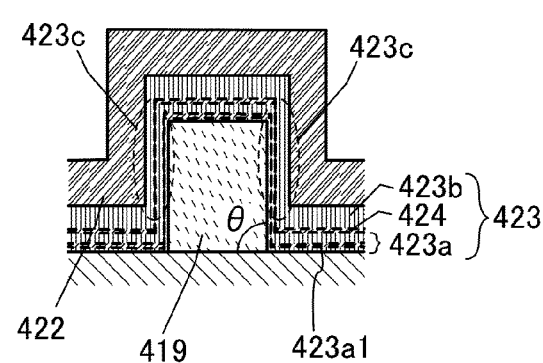
FIG. 2C is an enlarged view of a structure 419 provided between sub-pixels.

The configuration of the pixel 402 included in the display portion 401 is described with reference to FIGS. 2A to 2C. FIG. 2A is a plan view of the pixel 402. FIG. 2B is a cross-sectional view along a section line E-F in FIG. 2A. FIG. 2C is an enlarged view of the structure 419 between the sub-pixels. Note that in the plan view of FIG. 2A, some components (e.g., color filters 441B to 441R) of the pixel 402 are omitted in order to avoid complexity of the drawing.

The pixel 402 described in this embodiment as an example includes the sub-pixel 402B that emits blue light B, the sub-pixel 402G that emits green light G, and a sub-pixel 402R that emits red light R (see FIG. 2A). The sub-pixel 402B includes a driver transistor, a first light-emitting element 420a, and the color filter 441B. The sub-pixel 402G includes a driver transistor, the second light-emitting element 420b, and the color filter 441G. The sub-pixel 402R includes a driver transistor, a third light-emitting element 420c, and the color filter 441R. The first light-emitting element 420a includes a first lower electrode 421a, the upper electrode 422, and the EL layer 423. The second light-emitting element 420b includes the second lower electrode 421b, the upper electrode 422, and the EL layer 423. The third light-emitting element 420c includes a third lower electrode 421c, the upper electrode 422, and the EL layer 423. The end portions of the first lower electrode 421a are covered with the first partition wall 418a. The end portions of the second lower electrode 421b are covered with the second partition wall 418b. In addition, the end portions of the third lower electrode 421c are covered with the third partition wall 418c.

The EL layer 423 is a stacked-layer film which includes at least a light-emitting layer containing a light-emitting substance and a layer having higher conductivity than that of the light-emitting layer. As examples of the layer having higher conductivity than that of the light-emitting layer, a carrier-injection layer (a hole-injection layer or an electron-injection layer) and an intermediate layer can be given. In this embodiment, the EL layer 423 includes at least a first light-emitting unit 423a, a second light-emitting unit 423b, and an intermediate layer 424 provided between the first light-emitting unit 423a and the second light-emitting unit 423b (see FIG. 2B). The conductivity of the intermediate layer 424 is higher than that of the first light-emitting unit 423a and the second light-emitting unit 423b.

The light-emitting unit includes at least one light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

In the sub-pixel 402B, the color filter 441B through which blue light B can be extracted is provided on the upper electrode 422 side so as to overlap with the first light-emitting element 420a (see FIG. 2B). In a similar manner, in the sub-pixel 402G, the color filter 441G through which green light G can be extracted is provided so as to overlap with the second light-emitting element 420b. In the sub-pixel 402R, the color filter 441R through which red light R can be extracted is provided so as to overlap with the third light-emitting element 420c. The first, second, and third light-emitting elements 420a, 420b, and 420c in the respective sub-pixels have the same structure. When a light-emitting element which emits white light comprising red, blue, and green light components is used as each of the first, second, and third light-emitting elements 420a, 420b, and 420c, a display panel capable of full-color display can be provided.

Structure 419

The structure 419 over the insulating layer 416 is provided between the first to third lower electrodes 421a to 421c and surrounds each of the first to third lower electrodes 421a to 421c. That is, the structure 419 has a shape of a grating. In other words, the structure 419 surrounds the pixel 402 and the sub-pixels 402B, 402G, and 402R (see FIG. 2A).

The first, second, and third partition walls 418a, 418b, and 418c over the insulating layer 416 are provided between the structure 419 and the first, second, and third lower electrodes 421a, 421b, and 421c, respectively; and surround the end portions of the first, second, and third lower electrodes 421a, 421b, and 421c, respectively. In other words, the first, second, and third partition walls 418a, 418b, and 418c respectively surround the sub-pixels 402B, 402G, and 402R (see FIG. 2A). As a material of the partition wall 418, positive or negative photosensitive resin can be used.

The taper angle θ of the structure 419 (i.e., angle formed by the bottom surface and the side surface of the structure 419) is preferably greater than or equal to 60° and less than or equal to 110° (see FIG. 2C). Although an insulating material or a conductive material may be used for the structure 419, an inorganic material or a metal material is preferable because the taper angle θ can be increased.

In this pixel configuration 1, the structure 419 is formed using the same layer as the first to third lower electrodes 421a to 421c. Here, the expression "the structure 419 is formed using the same layer as the first to third lower electrodes 421a to 421c" means that the structure 419 is formed in the same step that is for forming the first to third lower electrodes 421a to 421c. Accordingly, the structure 419 can be formed without increasing the number of masks in photolithography and the manufacturing process can be simplified.

The first to third partition walls 418a to 418c cover the end portions of the first to third lower electrodes 421a to 421c, respectively. Thus, the difference in height between the highest point and the lowest point in the inclined surfaces on the structure 419 side of the first to third partition walls 418a to 418c is larger than that of the inclined surfaces on the side opposite to the structure 419 (i.e., the inclined surfaces on the first to third lower electrodes 421a to 421c side). Therefore, the inclined surfaces of the first to third partition walls 418a to 418c on the structure 419 side have inclination larger than the inclined surfaces of them on the side opposite to the structure 419 (see FIG. 2B).

Figure 3A:
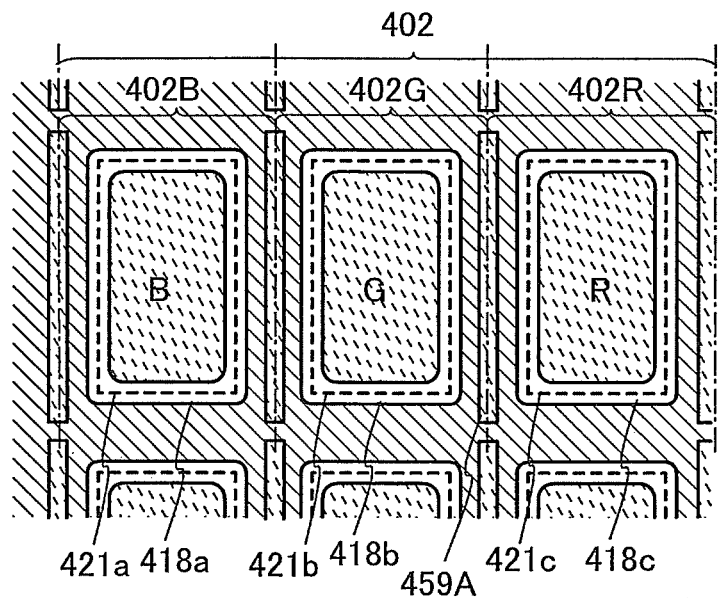
FIGS. 3A and 3B are plan views illustrating modification examples of the pixel 402.
Figure 3B:
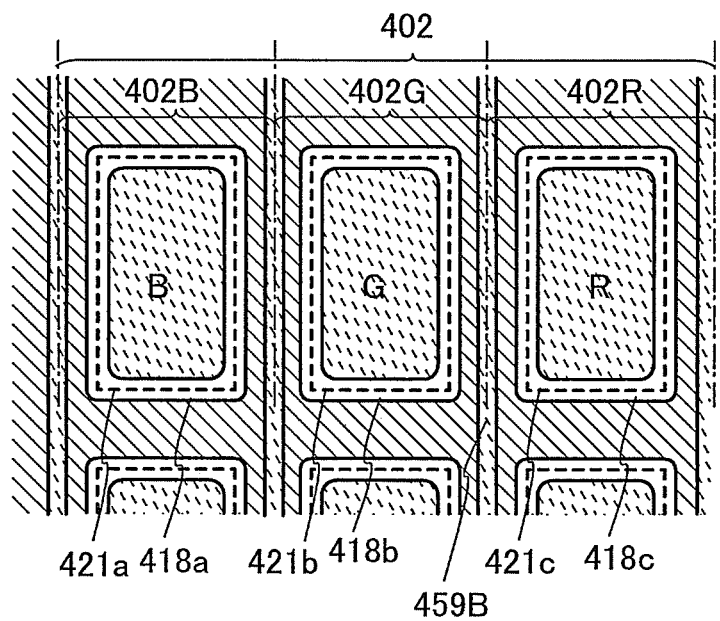

Although the structure 419 surrounds the sub-pixels 402B, 402G, and 402R as shown in FIG. 2A, the pixel configuration is not limited to this. For example, the structure 419 may be formed only between the first, second, and third lower electrodes 421a, 421b, and 421c as shown in FIGS. 3A and 3B. In other words, the structures 419 may be provided so as to separate one kind of the first to third lower electrodes 421a to 421c from the other two kinds of the lower electrodes. That is, a configuration may be employed in which the structure 419 (459A or 459B) is formed between sub-pixels having different colors and the structure is not formed between sub-pixels having the same color. Note that the configuration in FIG. 3A is an example in which a single structure 459A corresponds to a single sub-pixel. Further, the configuration in FIG. 3B is an example in which the structures 459B are provided in the form of stripes between sub-pixels having different colors.

The first light-emitting unit 423a is deposited over the first to third lower electrodes 421a to 421c, the first to third partition walls 418a to 418c, and the structures 419. The intermediate layer 424 is deposited on the first light-emitting unit 423a. The second light-emitting unit 423b is deposited on the intermediate layer 424. The upper electrode 422 is deposited on the second light-emitting unit 423b. Note that the upper electrode 422 may be deposited by a sputtering method, an evaporation method, or an evaporation method from an oblique direction to the surface of the substrate.

The EL layer 423 is unlikely to be deposited on the side surface of the structure 419, compared to the upper surface of the structure 419. Thus, a small-thickness region 423c is formed locally in the EL layer 423 on the side surface of the structure 419 (see FIG. 2C). In the region 423c, the thickness of a highly conductive layer (e.g., the intermediate layer 424) included in the EL layer 423 is also small, and thus the resistance of the highly conductive layer is increased. Accordingly, current does not easily flow to an adjacent sub-pixel and crosstalk can be prevented.

The thickness of the EL layer 423 in the direction perpendicular to the side surface of the structure 419 is smaller than that in the direction perpendicular to the second lower electrode 421b. Similarly, the thickness of a highly conductive layer (e.g., a carrier-injection layer 423a1) included in the EL layer 423 in the direction perpendicular to the side surfaces of the structure 419 is smaller than that in a direction perpendicular to the second lower electrode 421b (see FIG. 2C). This increases the electrical resistance of the highly conductive layer and weakens the conductivity thereof in parts overlapping the side surfaces of the structure 419. Consequently, current flow in the highly conductive layer is prevented, and a crosstalk phenomenon between adjacent pixels or sub-pixels emitting lights of different colors can be prevented.

Further, the thickness of the intermediate layer 424 in the direction perpendicular to the side surface of the structure 419 is smaller than that in the direction perpendicular to the second lower electrode 421b. This increases the electrical resistance of the intermediate layer 424 and weakens the conductivity thereof in parts overlapping the side surfaces of the structure 419. Consequently, current flow in the intermediate layer is prevented, and a crosstalk phenomenon between adjacent pixels or sub-pixels emitting lights of different colors can be prevented.

The EL layer 423 including the intermediate layer 424 and the upper electrode 422 over the side surfaces of the structure 419 may each be partly discontinuous; however, the upper electrode 422 is preferably continuous (connected). In the case where the upper electrode 422 is continuous, the potential of the upper electrode 422 is equal between adjacent pixels, and the upper electrode 422 has an equal potential in terms of a plane, or preferably the entire upper electrode 422 has an equal potential. Thus, an effect of preventing voltage drop or the like is obtained.

The EL layer 423 is unlikely to be deposited on inclined surfaces on the structure 419 side of the first and second partition walls 418a and 418b because the difference in height is large in the presence of the first and second lower electrodes 421a and 421b. As a result, small-thickness regions are formed locally in the EL layer 423 on the inclined surfaces (see FIG. 2B).

In the EL layer 423, the thickness in the direction perpendicular to the inclined surface on the structure 419 side of the first and second partition walls 418a and 418b is smaller than that in the direction perpendicular to the second lower electrode 421b. Similarly, the thickness of a highly conductive layer (e.g., a carrier-injection layer) included in the EL layer 423 in the direction perpendicular to the inclined surface on the structure 419 side of the first and second partition walls 418a and 418b is smaller than that in the direction perpendicular to the second lower electrode 421b (see FIG. 2B). This increases the electrical resistance of the highly conductive layer and weakens the conductivity thereof in parts overlapping the inclined surfaces. Consequently, current flow in the highly conductive layer is prevented, and the crosstalk phenomenon between adjacent pixels or sub-pixels emitting lights of different colors can be prevented.

Further, in the intermediate layer 424, the thickness in the direction perpendicular to the inclined surface on the structure 419 side of the first and second partition walls 418a and 418b is smaller than that in the direction perpendicular to the second lower electrode 421b. This increases the electrical resistance of the intermediate layer 424 and weakens the conductivity thereof in parts overlapping with the inclined surfaces of the partition walls. Consequently, current flow in the intermediate layer is prevented, and the crosstalk phenomenon between adjacent pixels or sub-pixels emitting lights of different colors can be prevented.

The EL layer 423 and the upper electrode 422 including the intermediate layer 424 over each inclined surface on the structure 419 side of the first and second partition walls 418a and 418b may each be partly discontinuous; however, the upper electrode 422 is preferably continuous. In the case where the upper electrode 422 is continuous, the potential of the upper electrode 422 is equal between adjacent pixels, and the upper electrode 422 has an equal potential in terms of a plane, or preferably the entire upper electrode 422 has an equal potential. Thus, an effect of preventing voltage drop or the like can be obtained.

The provision of the structure 419 elongates the path of current from one sub-pixel to the adjacent sub-pixel. That is, the length of the intermediate layer 424 on the structure 419 is large, compared to the case where the structure 419 is not provided. Accordingly, the electrical resistance of the intermediate layer 424 on the structure 419 can be increased. Consequently, current flow in the intermediate layer is prevented, and the crosstalk phenomenon between pixels or sub-pixels can be prevented. In other words, electrical crosstalk can be prevented by elongating the path of current in the intermediate layer 424, without increasing the height of the partition.

Further, the color filter 441G may be provided near or in contact with the upper electrode 422 positioned over the partition 418, so that the color filter 441G can be provided near the second light-emitting element 420b. In this case, optical crosstalk that is observed from an oblique direction to the sub-pixel (also referred to as light leakage) can be prevented.

Specifically, if the distance between the color filter 441G and the second light-emitting element 420b is long, light enters color filters 441B and 441R that are adjacent to the second light-emitting element 420b in a light emission state, whereby color purity is lowered. In contrast, because the structures 419 are formed between the first partition wall 418a covering each end of the first lower electrode 421a and the second partition wall 418b covering each end of the second lower electrode 421b, the heights of the first and second partition walls 418a and 418b can be reduced, compared to the case where the structure 419 is not formed. Accordingly, when the color filter 441G that is near or in contact with the upper electrode 422 positioned over the first and second partition walls 418a and 418b with reduced heights is provided so as to overlap the second light-emitting element 420b, the distance between the color filter 441G and the second light-emitting element 420b can be small, compared to the case where the structure 419 is not formed. As a result, color purity of the panel can be improved.

In addition, the structure 419 formed between the first partition wall 418a and the second partition wall 418b hinders waveguide light from traveling in a straight line, so that it is difficult that light from one pixel passes through the first and second partition walls 418a and 418b and reaches the adjacent pixel. As a result, optical crosstalk can be prevented.

Moreover, when the structure 419 is provided and the partition 418 is formed of a material that absorbs visible light and is colored, the partition can absorb waveguide light from the light-emitting element. Thus, an effect of preventing light leakage from a light-emitting element to the adjacent light-emitting element can be provided.

Furthermore, an image may be displayed on the first substrate 410 side in the following manner: as a lower electrode including the first to third lower electrodes 421a to 421c, a semi-transmissive and semi-reflective film is provided on the first substrate 410 side to extract light emitted from the first to third light-emitting elements 420a to 420c toward the first substrate 410 side.

Pixel Configuration 2

Figure 4A:
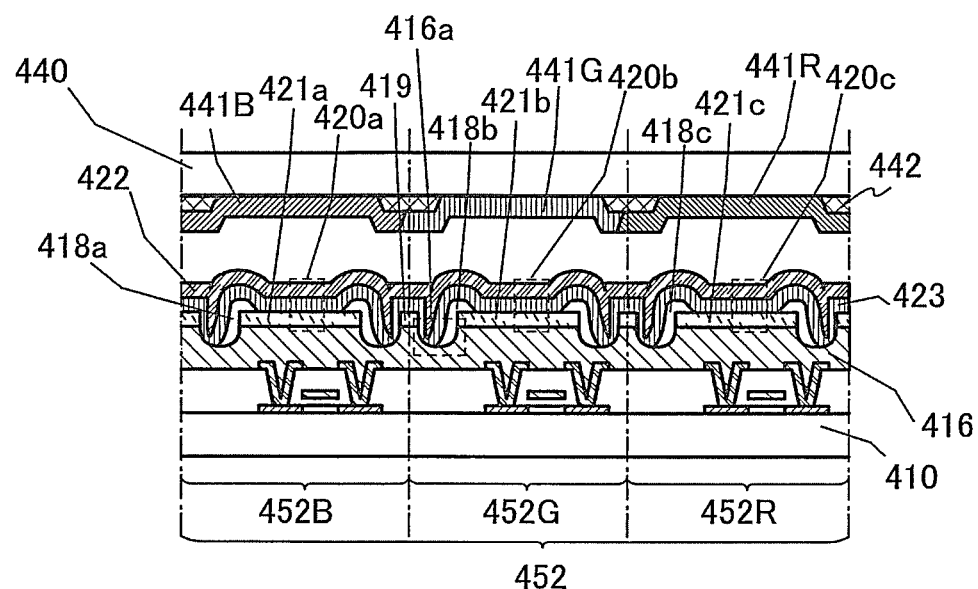
FIG. 4A is a cross-sectional view corresponding to the section line E-F in FIG. 2A.

The structure of a pixel 452 included in the display portion will be described with reference to FIG. 4A. FIG. 4A is a cross-sectional view along a section line E-F in FIG. 2A. The pixel 452 and sub-pixels 452B, 452G, and 452R in FIG. 4A correspond to the pixel 402 and the sub-pixels 402B, 402G, and 402R in FIG. 2A, respectively. In FIG. 4A, the same portions as those in the pixel configuration 1 are denoted by the same reference numerals and the description thereof is omitted.

Structure 419

The insulating layer 416 which is provided below the first to third lower electrodes 421a to 421c and the structure 419 is etched to form a groove portion 416a in a region of the insulating layer 416 between the structure 419 and the first to third lower electrodes 421a to 421c. The presence of the groove portion 416a increases the difference in height of the surface where the EL layer 423 is formed, compared to FIG. 2B. As a result, the thickness of the EL layer 423 in the direction perpendicular to the side surface of the structure 419, to the side surface of the groove portion 416a, and to inclined surface on the structure 419 side of the first to third partition walls 418a to 418c is smaller than that in the direction perpendicular to the first to third lower electrodes 421a to 421c (see FIG. 4A). Thus, occurrence of the crosstalk phenomenon between adjacent pixels or sub-pixels which emit light of different colors can be effectively suppressed.

In the case where the structures 419 are formed using the same layer as the first to third lower electrodes 421a to 421c, the groove portion 416a may be formed in the insulating layer 416 by overetching in photolithography for forming the first to third lower electrodes 421a to 421c and the structures 419; or alternatively by etching the insulating layer 416 using the first to third lower electrodes 421a to 421c and the structures 419 as masks. By these methods, the groove portion 416a can be formed without increasing the number of masks, which is preferable.

Pixel Configuration 3

Figure 4B:
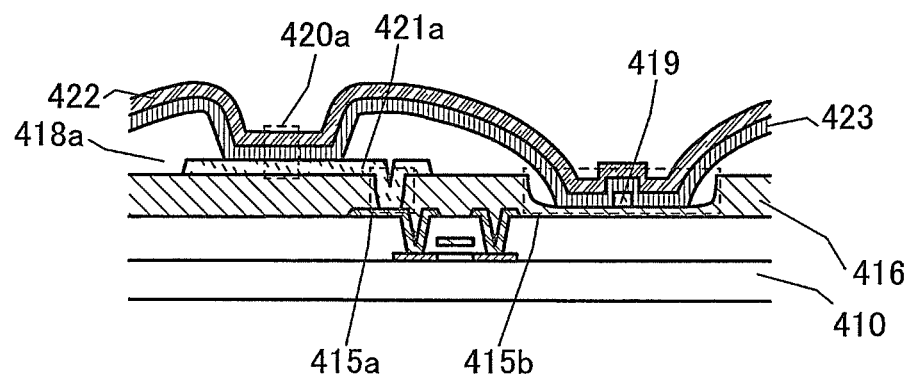
FIG. 4B is a cross-sectional view of a sub-pixel 402B corresponding to the section line E-F in FIG. 2A.

The structure of the pixel included in the display portion will be described with reference to FIG. 4B. FIG. 4B is a cross-sectional view corresponding to the sub-pixel 402B along a section line E-F in FIG. 2A. The second substrate 440 is not shown in FIG. 4B unlike FIG. 2B. In FIG. 4B, the same portions as those in the pixel configuration 1 are denoted by the same reference numerals and the description thereof is omitted.

Structure 419

As shown in FIG. 4B, a groove portion 415b is formed in the insulating layer 416 between the first lower electrode 421a and the second lower electrode 421b in the same step that is for forming a contact hole 415a for connecting a driver transistor to the first lower electrode 421a in the insulating layer 416.

The structure 419 is formed in the groove portion 415b. In the groove portion 415b and on the insulating layer 416, the first partition wall 418a and the second partition wall 418b are formed between the structure 419 and the first lower electrode 421a and between the structure 419 and the second lower electrode, respectively. The EL layer 423 is formed over the first lower electrode 421a, the first partition wall 418a, the structure 419, the second partition wall 418b, and the second lower electrode. The upper electrode 422 is formed over the EL layer 423.

According to the pixel configuration 3, the difference in height of the surface where the EL layer 423 is deposited can be large, compared to FIG. 2B. As a result, the thickness of the EL layer 423 in the direction perpendicular to the side surface of the structure 419 and to inclined surface on the structure 419 side of the first partition wall 418a is smaller than that in the direction perpendicular to the first lower electrode 421a (see FIG. 4B). Thus, occurrence of the crosstalk phenomenon between adjacent pixels or sub-pixels which emit light of different colors can be effectively suppressed.

Further, in this pixel configuration 3, since the groove portion 415b is formed in the same step that is for forming the contact hole 415a in the insulating layer 416, the groove portion 415b can be formed without increasing the number of masks, which is preferable.

Pixel Configuration 4

Figure 5A:
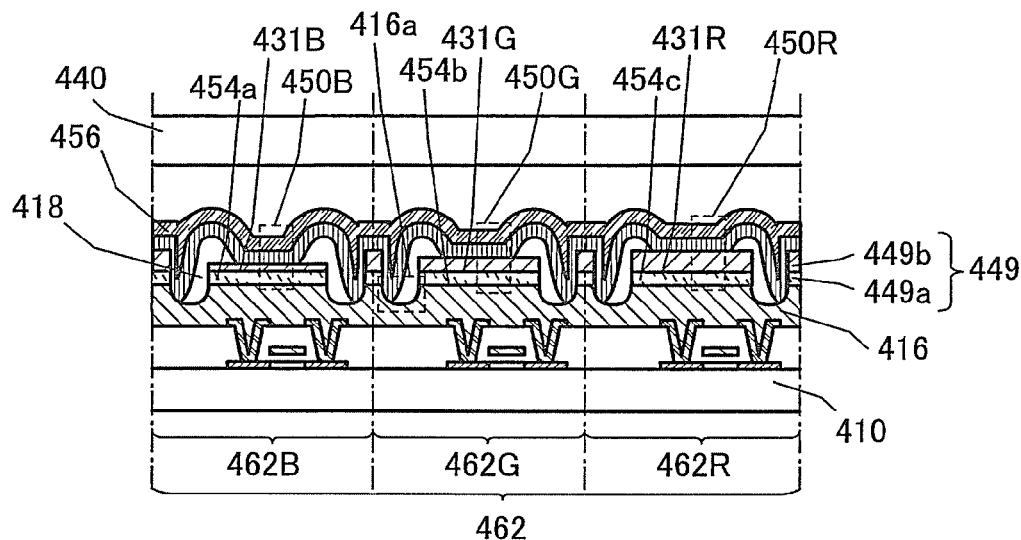
FIG. 5A is a cross-sectional view corresponding to the section line E-F in FIG. 2A.

The structure of a pixel 462 included in the display portion will be described with reference to FIG. 5A. The pixel 462 has a microresonator instead of the color filter illustrated in FIG. 2B. In FIG. 5A, the same portions as those in the pixel configuration 2 are denoted by the same reference numerals and the description thereof is omitted.

FIG. 5A is a cross-sectional view along a section line E-F in FIG. 2A. The pixel 462, sub-pixels 462B, 462G, and 462R, and a structure 449 in FIG. 5A correspond to the pixel 402, the sub-pixels 402B, 402G, and 402R, and the structure 419 in FIG. 2A, respectively. In FIG. 5A, the same portions as those in the pixel configuration 1 are denoted by the same reference numerals and the description thereof is omitted.

The pixel 462 illustrated in FIG. 5A as an example includes the sub-pixel 462B that emits blue light, the sub-pixel 462G that emits green light, and the sub-pixel 462R that emits red light. The sub-pixel 462B includes a driver transistor and a first light-emitting element 450B. The sub-pixel 462G includes a driver transistor and a second light-emitting element 450G. The sub-pixel 462R includes a driver transistor and a third light-emitting element 450R. In addition, the structure 449 including a first structure 449a and a second structure 449b is provided between the sub-pixels.

In each of the first, second, and third light-emitting elements 450B, 450G, and 450R which are included in the sub-pixels 462B, 462G, and 462R, a reflective film and a semi-transmissive and semi-reflective film overlap each other, thereby forming a microresonator. The EL layer 423 is provided between the reflective film and the semi-transmissive and semi-reflective film. In FIG. 5A, first, second, and third lower electrodes 454a, 454b, and 454c which have reflectivity are each provided as the reflective film, and an upper electrode 456 which has a semi-transmissive and semi-reflective property is provided as the semi-transmissive and semi-reflective film. In this manner, light with a specific wavelength can be efficiently extracted through the upper electrode 456 having a semi-transmissive and semi-reflective property. The light extraction efficiency can be increased by adjusting the optical path length of the microresonator so as to increase the intensity of the extracted light. The wavelength of extracted light depends on the distance between the reflective film and the semi-transmissive and semi-reflective film, and the distance can be adjusted by forming an optical adjustment layer between the reflective film and the semi-transmissive and semi-reflective film. Note that the EL layer 423 and the upper electrode 456 are common between the sub-pixels.

The first light-emitting element 450B included in the sub-pixel 462B includes, between the first lower electrode 454a having reflectivity and the upper electrode 456 having a semi-transmissive and semi-reflective property, an optical adjustment layer 431B for adjusting the optical path length between the first lower electrode 454a and the upper electrode 456 so as to increase the intensity of blue light (light with a wavelength longer than or equal to 400 nm and shorter than 500 nm). Owing to the optical adjustment layer 431B, blue light can be efficiently extracted.

The second light-emitting element 450G included in the sub-pixel 462G includes, between the second lower electrode 454b having reflectivity and the upper electrode 456 having a semi-transmissive and semi-reflective property, an optical adjustment layer 431G for adjusting the optical path length between the second lower electrode 454b and the upper electrode 456 so as to increase the intensity of green light (light with a wavelength longer than or equal to 500 nm and shorter than 600 nm). Owing to the optical adjustment layer 431G, green light can be efficiently extracted.

The third light-emitting element 450R included in the sub-pixel 462R includes, between the third lower electrode 454c having reflectivity and the upper electrode 456 having a semi-transmissive and semi-reflective property, an optical adjustment layer 431R for adjusting the optical path length between the third lower electrode 454c and the upper electrode 456 so as to increase the intensity of red light (light with a wavelength longer than or equal to 600 nm and shorter than 800 nm). Owing to the optical adjustment layer 431R, red light can be efficiently extracted.

In the first, second, and third light-emitting elements 450B, 450G, and 450R with the above-described structures, interference of light emitted from the EL layer 423 occurs between the reflective film and the semi-transmissive and semi-reflective film, and thus the intensity of light with a specific wavelength among light with a wavelength longer than or equal to 400 nm and shorter than 800 nm is increased.

A conductive film having light-transmitting properties with respect to visible light or a layer containing a light-emitting organic compound can be employed for a material that can be used for the optical adjustment layer. For example, the thickness of a charge-generation region may be adjusted so that the charge-generation region also serves as the optical adjustment layer. Alternatively, the thickness of a region containing a substance having a high hole-transport property and a substance exhibiting an acceptor property with respect to the substance having a high hole-transport property may be adjusted so that the layer of the mixed substances also serves as the optical adjustment layer. This structure is preferably used because an increase in driving voltage can be prevented even when the optical adjustment layer is thick.

The thickness of the optical adjustment layer is adjusted in accordance with the wavelength of light extracted from the light-emitting element.

Structure 449

In the example illustrated in FIG. 5A, the stacked-layer structure of the structure 449 between the sub-pixels includes the following: the first structure 449a formed in the same process that is for forming the first, second, and third lower electrodes 454a, 454b, and 454c of the first, second, and third light-emitting elements 450B, 450G, and 450R; and the second structure 449b formed in the same process for forming the optical adjustment layer 431R of the third light-emitting element 450R. However, the present invention is not limited to this structure. For example, it is possible to employ a stacked-layer structure which includes the first structure 449a and an electrode layer formed in the same process that is for forming the optical adjustment layer 431B of the first light-emitting element 450B. It is also possible to employ a stacked-layer structure which includes the first structure 449a and an electrode layer formed in the same process that is for forming the optical adjustment layer 431G of the second light-emitting element 450G.

Pixel Configuration 5

Figure 5B:
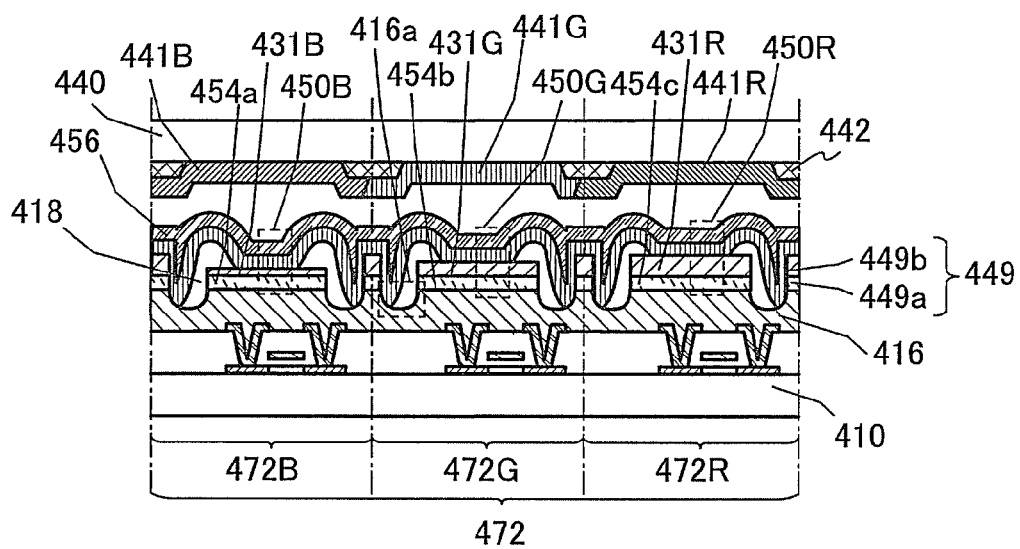
FIG. 5B is a cross-sectional view illustrating a modification example of a pixel 462 in FIG. 5A.

The structure of a pixel 472 included in the display portion is described with reference to FIG. 5B. The pixel 472 illustrated in FIG. 5B is a variation of the pixel 462 illustrated in FIG. 5A. In the pixel 472, the color filters 441B, 441G, and 441R and the light-blocking film 442 are provided on the second substrate 440 side. That is, the pixel 472 is provided with both the color filters and microresonators.

In FIG. 5B, the sub-pixel 472B includes a driver transistor, the first light-emitting element 450B, and the color filter 441B which transmits blue light. The sub-pixel 472G includes a driver transistor, the second light-emitting element 450G, and the color filter 441G which transmits green light. The sub-pixel 472R includes a driver transistor, the third light-emitting element 450R, and the color filter 441R which transmits red light.

The color filters, which absorb unnecessary light, are added to the structure illustrated in FIG. 5A, whereby color purities can be increased. Note that components other than the color filters are similar to the components in FIG. 5A, and thus detailed description thereof is omitted.

Example

In Example, a display panel of one embodiment of the present invention and a display panel of a comparative example were fabricated to confirm effect of a structure formed between sub-pixels on reduction of crosstalk.

Display Panel of Example

Figure 6A:
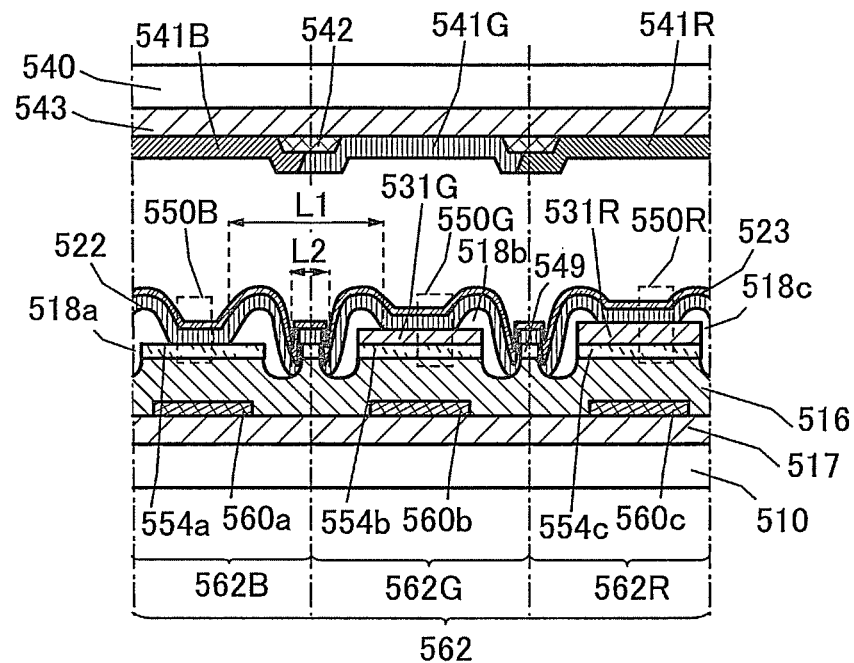
FIG. 6A is a schematic view of a pixel 562 included in a display panel of Example.

A schematic view of the pixel 562 included in the display panel of Example is shown in FIG. 6A. The pixel 562 includes the sub-pixel 562B that emits blue light, the sub-pixel 562G that emits green light, and a sub-pixel 562R that emits red light. The sub-pixel 562B includes a color filter layer 541B and a light-emitting element 550B. The sub-pixel 562G includes a color filter layer 541G and a light-emitting element 550G. The sub-pixel 562R includes a color filter layer 541R and a light-emitting element 550R.

A method for fabricating the display panel of Example is described below. Note that the display panel of Example corresponds to the panel having the above-described pixel configuration 5.

First, over a glass substrate 510, a 300-nm-thick silicon oxide film was formed as a base insulating layer 517 by sputtering. Then, wirings 560a, 560b, and 560c were formed to electrically connect lower electrodes of light-emitting elements formed later. The wirings 560a, 560b, and 560c correspond to a source electrode or a drain electrode of a current control transistor of the embodiments. The wirings 560a, 560b, and 560c each had a layered structure of a 100-nm-thick titanium film, a 900-nm-thick aluminum film, and a 100-nm-thick titanium film. The distance between the wirings 560a and 560b and between the wirings 560b and 560c was 12 μm.

Next, a 1.4-μm-thick polyimide film was formed as an insulating layer 516 over the wirings 560a, 560b, and 560c. Then, over the insulating layer 516, a 200-nm-thick aluminum-nickel alloy film (Al—Ni—La) containing lanthanum was formed by sputtering. Further, a 6-nm-thick titanium film was formed by sputtering.

The deposited Al—Ni—La film and the titanium film were processed by photolithography to form a first lower electrode 554a, a second lower electrode 554b, a third lower electrode 554c, and the structures 549. The structures 549 are provided in the form of stripes between the first to third lower electrodes 554a to 554c and between the sub-pixels. The distance between the first lower electrode 554a and the second lower electrode 554b and between the second lower electrode 554b and the third lower electrode 554c was 8 μm. The width of the structure 549 in the cross-sectional view of FIG. 6A was 2 μm. In Example, the design value of the taper angle of the structure 549 was 110°.

Note that when the first to third lower electrodes 554a to 554c and the structure 549 were formed, overetching was performed to etch the insulating layer 516 in regions where the first to third lower electrodes 554a to 554c and the structure 549 did not overlap the insulating layer 516. Accordingly, groove portions were formed between the first to third lower electrodes 554a to 554c and the structure 549.

Next, an optical adjustment layer was formed over the second and third lower electrodes 554b and 554c. In Example, a 40-nm-thick indium-tin oxide film containing silicon oxide (ITSO) was formed as an optical adjustment layer 531G over the second lower electrode 554b. Further, an 80-nm-thick ITSO film was formed as an optical adjustment layer 531R over the third lower electrode 554c. Note that an optical adjustment layer was not formed over the first lower electrode 554a.

Next, a 1.4-μm-thick polyimide film was formed and processed by photolithography to form a first partition wall layer 518a, a second partition wall layer 518b, and a third partition wall layer 518c which cover the end portions of the first lower electrode 554a, the end portions of the second lower electrode 554b, and the end portions of the third lower electrode 554c, respectively. In Example, the distance (L1 in FIG. 6A) between one end portion of the first partition wall layer 518a over the first lower electrode 554a and one end portion of the second partition wall layer 518b over the second lower electrode 554b was 11 μm. Note that the distance between the end portion of the second partition wall layer 518b over the second lower electrode 554b and the end portion of the third partition wall layer 518c over the third lower electrode 554c was also 11 μm. The shortest distance (L2 in FIG. 6A) between the first partition wall layer 518a and the second partition wall layer 518b was 6 μm. The shortest distance between the second partition wall layer 518b and the third partition wall layer 518c was also 6 μm.

After that, an EL layer 522 was formed to have a thickness of 195.3 nm, over the first to third partition wall layers 518a to 518c, the first to third lower electrodes 554a to 554c, the structures 549, and the optical adjustment layers 531G and 531R.

As an upper electrode 523, a 1.1-nm-thick magnesium-silver alloy film, a 13.9-nm-thick silver film, and a 70-nm-thick indium-tin oxide film were formed over the EL layer 522.

Through the above, the light-emitting elements 550B, 550G, and 550R were formed.

Next, a method for manufacturing a counter substrate 540 is described below.

Over a glass substrate, a 100-nm-thick silicon oxynitride film was deposited as a base film 543, and a light-blocking layer 542 was formed over the base film 543, so that the counter substrate 540 was formed. As the material of the light-blocking layer 542, an organic resin containing a black resin (carbon black) was used. Then, the color filter layers 541B, 541G, and 541R were formed over the light-blocking layer 542.

The glass substrate 510 was bonded to the counter substrate 540, so that the display panel of Example was fabricated.

Display Panel of Comparative Example

Figure 6B:
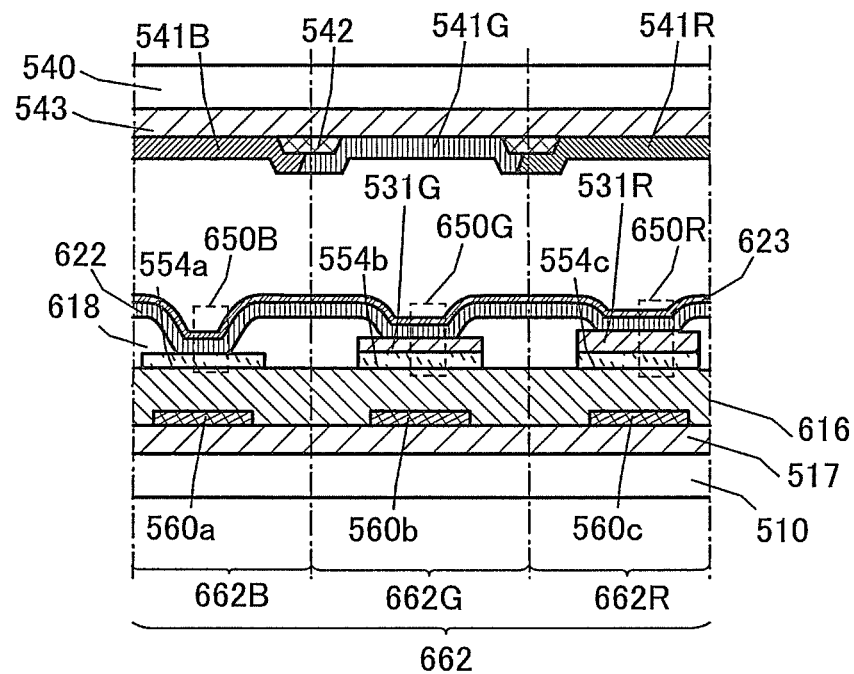
FIG. 6B is a schematic view of a pixel 662 included in a display panel of a comparative example.

A schematic view of the pixel 662 included in the display panel of a comparative example is shown in FIG. 6B. The pixel 662 includes the sub-pixel 662B that emits blue light, the sub-pixel 662G that emits green light, and the sub-pixel 662R that emits red light. The display panel of the comparative example is different from the light-emitting panel of Example in that a structure is not provided between sub-pixels and in that a groove portion is not provided between lower electrodes. The other configurations are the same as those of the light-emitting panel of Example; thus, detailed description is omitted.

The sub-pixel 662B includes a light-emitting element 650B and a color filter layer 541B. The sub-pixel 662G includes a light-emitting element 650G and a color filter layer 541G. The sub-pixel 662R includes a light-emitting element 650R and a color filter layer 541R. Further, the light-emitting elements include an EL layer 622 between the first to third lower electrodes 554a to 554c and the upper electrode 623. In the light-emitting element 650G, the optical adjustment layer 531G is included on the second lower electrode 554b. In the light-emitting element 650R, the optical adjustment layer 531R is included on the third lower electrode 554c.

In the display panel of a comparative example, a partition wall layer 618 is formed to cover the end portions of the first to third lower electrodes 554a to 554c.

FIG. 7A is a cross-sectional image of the fabricated light-emitting panel of Example between the sub-pixels 562B and 562G. FIGS. 7B and 7C are enlarged cross-sectional images of a region around the side surfaces of the structure 549. FIG. 7D is a cross-sectional image of the light-emitting panel of a comparative example between the sub-pixels 662B and 662G.

As in FIG. 7D, in the light-emitting panel of a comparative example, the thickness of the upper electrode in a region B1 that does not overlap the partition wall layer 618 and overlaps the second lower electrode 554b was 179 nm. The thickness of the upper electrode in a region B2 overlapping the side surface of the partition layer 618 was 140 nm. The thickness of the upper electrode in a region B3 that overlaps a region between the first lower electrode 554a and the second lower electrode 554b was 194 nm. That is, the thickness of the upper electrode included in the light-emitting panel of a comparative example was substantially uniform in all the regions of the first lower electrode 554a and the second lower electrode 554b. This suggests that the thicknesses of the EL layer included in the light-emitting panel of a comparative example is also substantially uniform in all the regions of the first lower electrode 554a and the second lower electrode 554b.

On the other hand, as in FIGS. 7A and 7B, in the light-emitting panel of Example, the thickness of the upper electrode in a region A1 that does not overlap the second partition wall layer 518b and overlaps the second lower electrode 554b was 180 nm, whereas the thickness of the upper electrode in a region A2 that overlaps the side surface of the second partition wall layer 518b was 87 nm; thus, reduction in thickness was observed. Further, the thickness of the upper electrode in a region A3 that is around the side surface of the structure 549 (more specifically, a region in contact with the groove portion of the insulating layer 516 which was etched using the structure 549 as a mask) was 38 nm, which was a further reduction in thickness. This suggests that the thickness of the EL layer included in the light-emitting panel of Example is reduced in the region A2 that overlaps the side surface of the second partition wall layer 518b and in the region A3 that is around the side surface of the structure 549. In addition, the taper angle of the structure 549 was 109° in FIG. 7C.

Next, the luminance dependence of NTSC (National Television Standards Committee) ratio of the fabricated light-emitting panels were measured. The measurement results are shown in FIG. 8.

Figure 8:
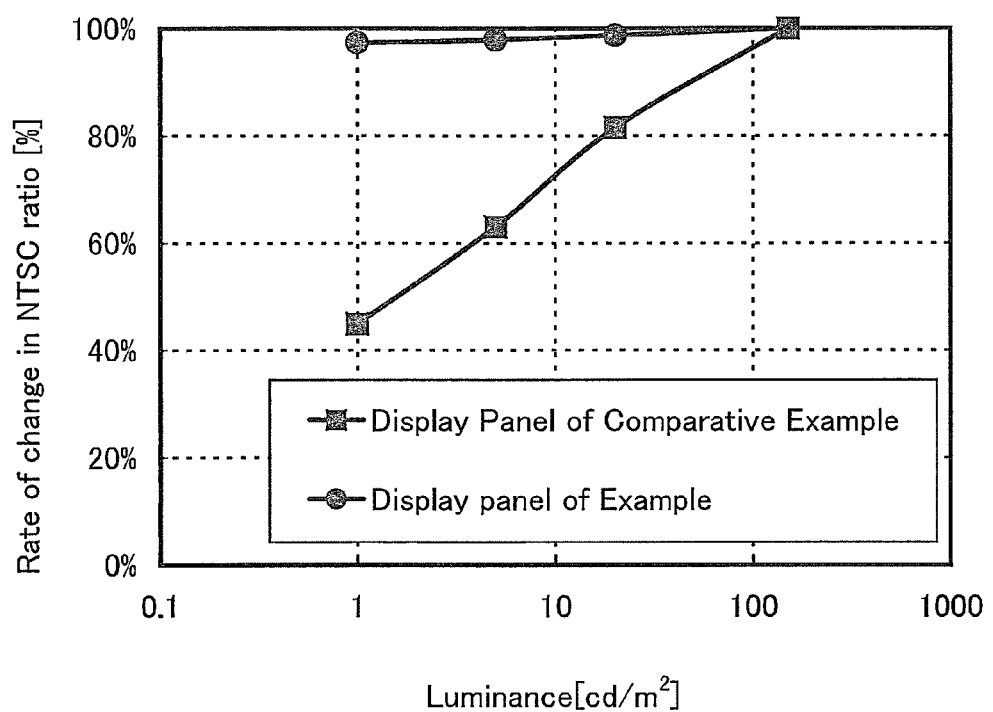
FIG. 8 is a graph showing measurement results of the luminance dependence of NTSC ratio of the light-emitting panels.
Figure 9A:
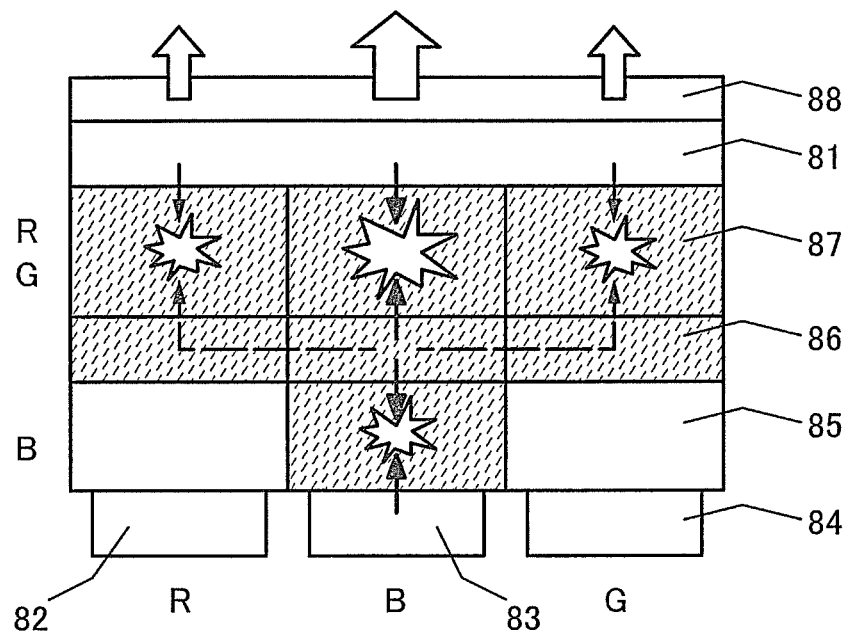
FIG. 9A is a schematic view for describing a crosstalk phenomenon caused by a highly conductive intermediate layer.
Figure 9B:
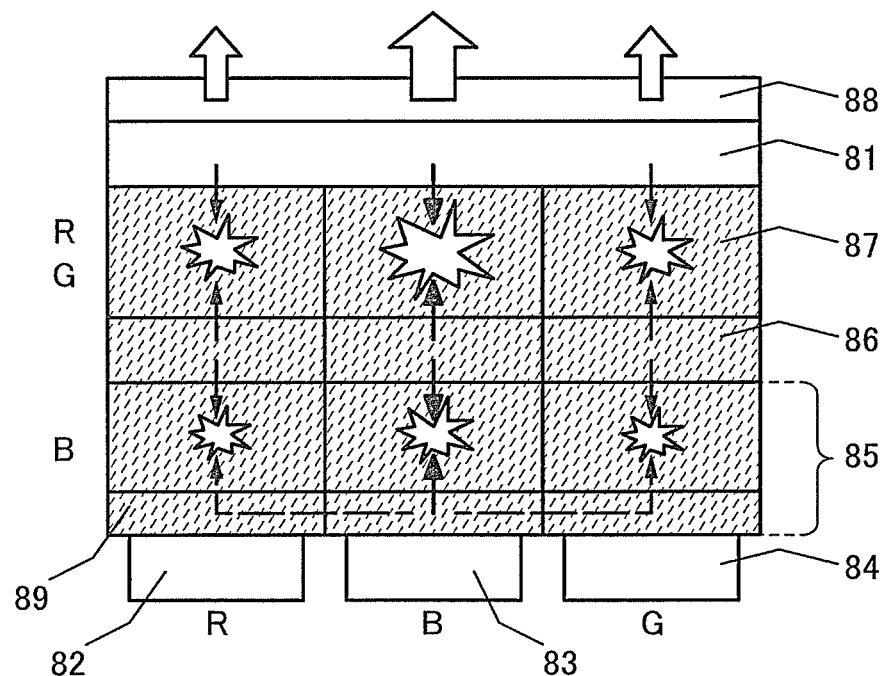
FIG. 9B is a schematic view for describing a crosstalk phenomenon caused by a highly conductive carrier-injection layer.

In FIG. 8, the horizontal axis indicates the luminance (cd/m$^2$) and the vertical axis indicates the rate of change in NTSC ratio (%). Note that in FIG. 8, the rate of change is normalized by setting a value of NTSC ratio at the luminance of 150 cd/m$^2$ at 100%.

As in FIG. 8, the NTSC ratio of the light-emitting panel of a comparative example decreases as the luminance is lowered. In contrast, the NTSC ratio of the light-emitting panel of Example was kept at 97.3% of that at the luminance of 150 cd/m$^2$ even when the luminance was at 1 cd/m$^2$.

Therefore, the above results show that the EL layer whose thickness is locally small included in the light-emitting panel of Example can suppress crosstalk and degradation in NTSC ratio, particularly on the low luminance side.

This application is based on Japanese Patent Application serial no. 2013-046907 filed with Japan Patent Office on Mar. 8, 2013, the entire contents of which are hereby incorporated by reference.

What is claimed is:

1. A light-emitting device comprising:
   an insulating layer;
   a first electrode over the insulating layer;
   a second electrode over the insulating layer;
   a structure over the insulating layer and between the first electrode and the second electrode;
   a first partition wall between the first electrode and the structure, the first partition wall covering an end portion of the first electrode;
   a second partition wall between the second electrode and the structure, the second partition wall covering an end portion of the second electrode;
   a first light-emitting unit over the first electrode, the first partition wall, the structure, the second partition wall, and the second electrode;
   an intermediate layer over the first light-emitting unit;

a second light-emitting unit over the first light-emitting unit with the intermediate layer therebetween; and a third electrode over the second light-emitting unit, wherein the first light-emitting unit, the intermediate layer, and the second light-emitting unit are provided between the structure and the first partition wall and between the structure and the second partition wall.

2. The light-emitting device according to claim 1, further comprising a groove portion in the insulating layer, wherein an EL layer comprises at least the first light-emitting unit, wherein the groove portion is located between the first electrode and the structure and between the second electrode and the structure, wherein at least one of the first partition wall and the second partition wall covers a part of a surface of the groove portion, and wherein the EL layer covers an another part of the surface of the groove portion.

3. The light-emitting device according to claim 1, further comprising an optical adjustment layer at least one of between the first electrode and the first light-emitting unit and between the second electrode and the first light-emitting unit, wherein the structure is a stacked body which includes a layer formed using the same layer as the first electrode and a layer formed using the same layer as the optical adjustment layer.

4. The light-emitting device according to claim 1, wherein a thickness of the intermediate layer over a side surface of the structure in a direction perpendicular to the side surface of the structure is smaller than a thickness of the intermediate layer over the first electrode in a direction perpendicular to a top surface of the first electrode.

5. The light-emitting device according to claim 1, wherein the first light-emitting unit comprises a carrier injection layer, and wherein a thickness of the carrier injection layer over a side surface of the structure in a direction perpendicular to the side surface of the structure is smaller than a thickness of the carrier injection layer over the first electrode in a direction perpendicular to a top surface of the first electrode.

6. The light-emitting device according to claim 1, wherein an EL layer comprises the first light-emitting unit, the intermediate layer, and the second light-emitting unit, and wherein a thickness of the EL layer over a side surface of the structure in a direction perpendicular to the side surface of the structure is smaller than a thickness of the EL layer over the first electrode in a direction perpendicular to a top surface of the first electrode.

7. The light-emitting device according to claim 1, wherein an angle formed by a side surface of the structure and a bottom surface of the structure is greater than or equal to 60° and less than or equal to 110°.

8. The light-emitting device according to claim 1, further comprising a groove portion in the insulating layer, wherein the groove portion is provided between the structure and the first electrode, the structure being formed using the same layer as the first electrode.

9. The light-emitting device according to claim 1, further comprising:

a first color filter over the first partition wall and the second partition wall, the first color filter overlapping with the first electrode; and a second color filter over the first partition wall and the second partition wall, the second color filter overlapping with the second electrode.

10. The light-emitting device according to claim 1, wherein the first partition wall and the second partition wall are colored.

11. The light-emitting device according to claim 1, wherein the structure surrounds each of the first electrode and the second electrode, and wherein the first partition wall and the second partition wall surround the first electrode and the second electrode, respectively.

12. A light-emitting device comprising:

an insulating layer;

a first electrode over the insulating layer;

a second electrode over the insulating layer;

a groove portion in the insulating layer and between the first electrode and the second electrode;

a structure over the insulating layer and in the groove portion;

a first partition wall in the groove portion, the first partition wall being between the first electrode and the structure and covering an end portion of the first electrode;

a second partition wall in the groove portion, the second partition wall being between the second electrode and the structure and covering an end portion of the second electrode;

a first light-emitting unit over the first electrode, the first partition wall, the structure, the second partition wall, and the second electrode;

an intermediate layer over the first light-emitting unit;

a second light-emitting unit over the first light-emitting unit with the intermediate layer therebetween; and a third electrode over the second light-emitting unit, wherein the first light-emitting unit, the intermediate layer, and the second light-emitting unit are provided between the structure and the first partition wall and between the structure and the second partition wall.

13. The light-emitting device according to claim 12, further comprising an optical adjustment layer at least one of between the first electrode and the first light-emitting unit and between the second electrode and the first light-emitting unit, wherein the structure is a stacked body which includes a layer formed using the same layer as the first electrode and a layer formed using the same layer as the optical adjustment layer.

14. The light-emitting device according to claim 12, wherein a thickness of the intermediate layer over a side surface of the structure in a direction perpendicular to the side surface of the structure is smaller than a thickness of the intermediate layer over the first electrode in a direction perpendicular to a top surface of the first electrode.

15. The light-emitting device according to claim 12, wherein the first light-emitting unit comprises a carrier injection layer, and wherein a thickness of the carrier injection layer over a side surface of the structure in a direction perpendicular to the side surface of the structure is smaller than a thickness of the carrier injection layer over the first electrode in a direction perpendicular to a top surface of the first electrode.

16. The light-emitting device according to claim 12, wherein an EL layer comprises the first light-emitting unit, the intermediate layer, and the second light-emitting unit, and wherein a thickness of the EL layer over a side surface of the structure in a direction perpendicular to the side surface of the structure is smaller than a thickness of the EL layer over the first electrode in a direction perpendicular to a top surface of the first electrode.

17. The light-emitting device according to claim 12,
wherein an angle formed by a side surface of the structure and a bottom surface of the structure is greater than or equal to 60° and less than or equal to 110°.

18. The light-emitting device according to claim 12,
wherein the groove portion is provided between the structure and the first electrode, the structure being formed using the same layer as the first electrode.

19. The light-emitting device according to claim 12, further comprising:
a first color filter over the first partition wall and the second partition wall, the first color filter overlapping with the first electrode; and
a second color filter over the first partition wall and the second partition wall, the second color filter overlapping with the second electrode.

20. The light-emitting device according to claim 12,
wherein the first partition wall and the second partition wall are colored.

21. The light-emitting device according to claim 12,
wherein the structure surrounds each of the first electrode and the second electrode, and
wherein the first partition wall and the second partition wall surround the first electrode and the second electrode, respectively.

22. The light-emitting device according to claim 1,
wherein the first light-emitting unit is in contact with the insulating layer.

23. The light-emitting device according to claim 12,
wherein the first light-emitting unit is in contact with the insulating layer.

* * * * *